(12) United States Patent
Dalla Piazza et al.

(10) Patent No.: US 6,700,313 B2
(45) Date of Patent: Mar. 2, 2004

(54) PIEZOELECTRIC RESONATOR AND ASSEMBLY COMPRISING THE SAME ENCLOSED IN A CASE

(75) Inventors: Silvio Dalla Piazza, St-Imier (CH); Thomas Lüthi, Grenchen (CH); Bruno Studer, Riedholz (CH)

(73) Assignee: Eta Sa Fabriques D'Ebauches, Grenchen (CH)

( * ) Notice: Subject to any disclaimer, the term of this patent is extended or adjusted under 35 U.S.C. 154(b) by 53 days.

(21) Appl. No.: 10/259,571

(22) Filed: Sep. 30, 2002

(65) Prior Publication Data

US 2003/0067248 A1 Apr. 10, 2003

(30) Foreign Application Priority Data

Oct. 9, 2001 (CH) .............................................. 1859/01

(51) Int. Cl.⁷ .......................... H03H 9/17; H01L 41/047
(52) U.S. Cl. ........................ 310/370; 310/366; 310/340; 310/353; 310/348
(58) Field of Search .................... 310/340, 344, 310/348, 353, 366, 370

(56) References Cited

U.S. PATENT DOCUMENTS

| | | | |
|---|---|---|---|
| 3,657,667 A | * | 4/1972 | Nishikubo et al. ....... 331/116 M |
| 4,508,807 A | * | 4/1985 | Terayama .................. 310/348 |
| 5,451,828 A | * | 9/1995 | Tomikawa et al. .......... 310/370 |
| 5,674,258 A | * | 10/1997 | Henschel et al. ............. 607/19 |
| 5,691,595 A | * | 11/1997 | Tomikawa et al. .......... 310/370 |
| 6,053,044 A | * | 4/2000 | Ohnishi et al. .......... 73/504.15 |
| 6,545,392 B2 | * | 4/2003 | Kawauchi et al. .......... 310/344 |

FOREIGN PATENT DOCUMENTS

| | | |
|---|---|---|
| DE | 199 02 339 A1 | 7/1999 |
| GB | 1 425 435 | 2/1976 |
| GB | 1 465 863 | 3/1977 |
| JP | 57-17216 A * | 1/1982 ................. 310/361 |

OTHER PUBLICATIONS

Patent Abstracts of Japan, vol. 015, No. 024 (P–1156), Jan. 21, 1991 and JP 02 268220, Nov. 1, 1990.
Patent Abstracts of Japan, vol. 007, No. 267 (E–213), Nov. 29, 1983 & JP 58 150317, Sep. 7, 1983.

* cited by examiner

Primary Examiner—Thomas M. Dougherty
(74) Attorney, Agent, or Firm—Sughrue Mion, PLLC

(57) ABSTRACT

The resonator according to the invention, which is intended to be mounted in a case, includes a tuning fork shaped part (42) with two parallel arms (44, 46) connected to each other by a base (48) and carrying electrodes (52, 54) to make them vibrate, these electrodes being connected to connection pads (60, 62) intended to be electrically connected to the exterior of the case. In accordance with the invention, the resonator (40) also includes a central arm (50) attached to the base (48) and located between the arms (44, 46) of the tuning fork shaped part (42), substantially equidistant from them, this central arm (50) having a greater mass than that of the arms of the tuning fork shaped part and the connection pads (60, 62) are carried by this central arm.

This resonator (40) is mounted in a case of parallelepiped shape by fixing its central arm (50) to at least one support secured to the bottom of the case.

19 Claims, 4 Drawing Sheets

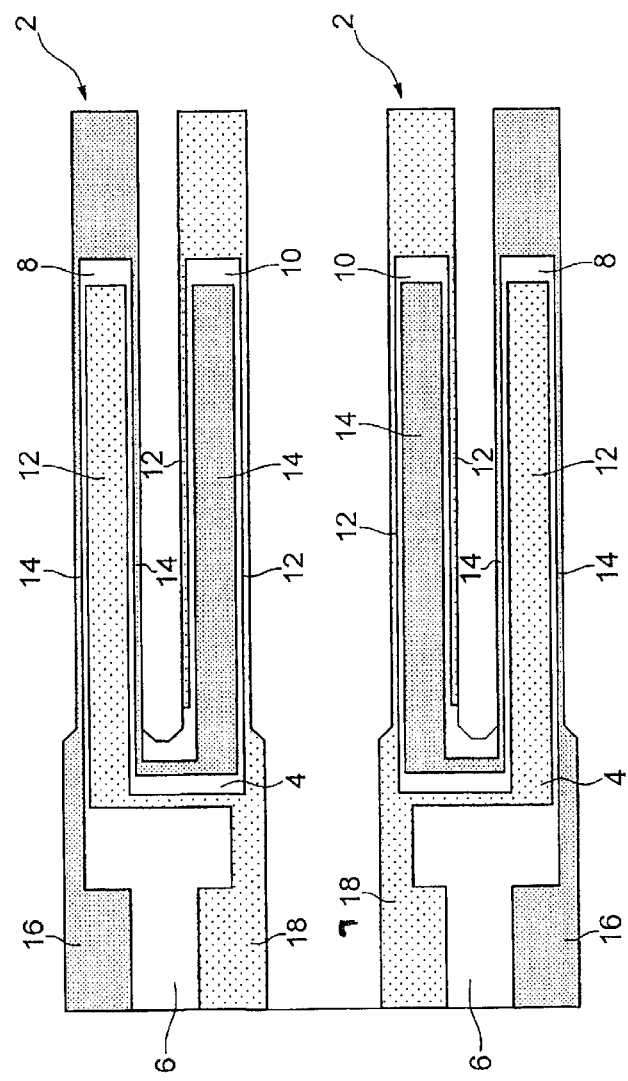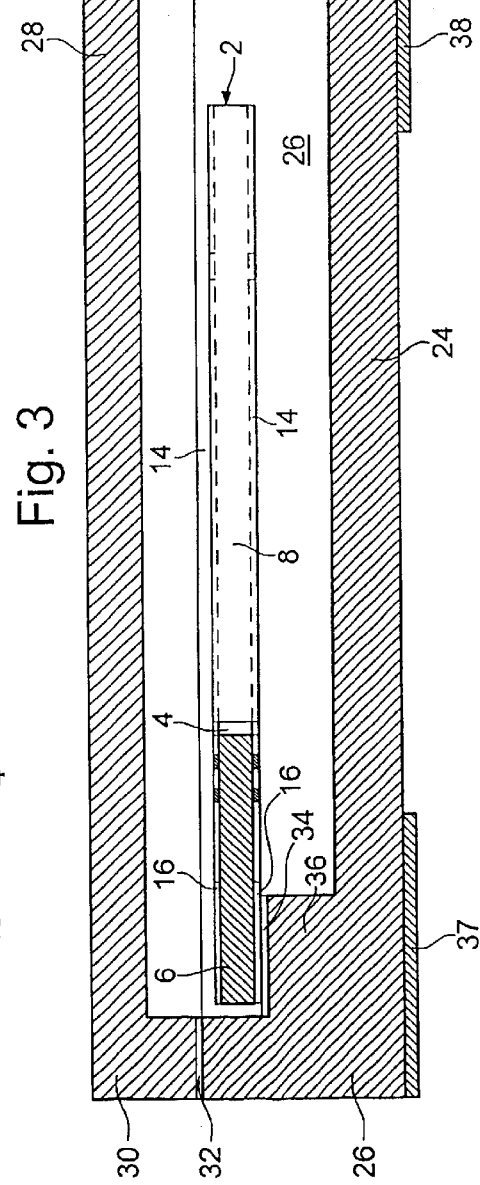

PIEZOELECTRIC RESONATOR AND ASSEMBLY COMPRISING THE SAME ENCLOSED IN A CASE

The present invention concerns piezoelectric resonators and more particularly resonators of small dimensions which are most often used for making frequency generators in particular for portable electronic equipment, in numerous fields such as horology, information technology, telecommunications and the medical field.

Most quartz resonators of small dimensions that are currently used in horology and particularly in electronic or electromechanical watches are quartz tuning fork resonators, which are enclosed in a vacuum or in an inert gas atmosphere in so-called "metallic" cases.

These metallic cases are cases of elongated shape which include a base of essentially cylindrical contour, onto which a metal cap also of cylindrical shape is driven, said case being able to be advantageously manufactured by stamping. In this case, the electric connection between the resonator electrodes and the exterior of the case is assured by two wires or two metal strips which pass through an insulating part of the base and whose inner ends are soldered or glued with the aid of a conductive adhesive onto contact pads of the resonator, so that the wires or strips are also used as a support for the resonator.

Quartz tuning fork resonators have the advantage of being able to be manufactured on a very large scale and at very low cost, by photolithographic techniques, which means that they are also very often used as they are with another type of case, in particular for non-horological applications.

These cases of another type, called "ceramic cases", are relatively flat cases which generally include a main part of parallelepiped shape made of ceramic material, inside which the resonator is mounted, a rectangular cover with or without an edge, which can be made of ceramic material, glass or metal and which is soldered via a sealing gasket onto the main part and a connection system which can take different forms for electrically connecting the excitation electrodes of the resonator to the exterior of the case.

Now, the mounting of a tuning fork resonator in this type of case poses problems.

One of these problems is that the dimensional and functional features of the resonators are optimised for mounting them in metallic cases and not in ceramic cases. For example, the ratio between their length and their width is ill suited to the manufacture of such cases, in particular when the cases are of the SMD (Surface Mounting Device) type, i.e. meant to be automatically mounted on hole-free printed circuit boards.

FIGS. 1 and 2 are intended to assist comprehension of other problems posed by mounting a tuning fork in a ceramic case.

These Figures are plan top and bottom views of a conventional tuning fork resonator, like those that are currently used in horology and which are designed to vibrate in flexure mode.

This resonator 2 includes a quartz tuning fork 4 whose base 6 and arms 8 and 10 carry metallisations which form, on the arms, two groups of electrodes 12 and 14 which allow them to be subjected to electric fields to make them vibrate and, on base 6, connection pads 16 and 18 respectively connected to electrode groups 12 and 14.

FIG. 3 is a median and longitudinal cross-section view which shows schematically how resonator 2 of FIGS. 1 and 2 is generally mounted in an SMD type ceramic case 20.

This case 20 of parallelepiped shape includes a main part 22 with a bottom 24 and sides 26 and a cover 28 with an edge 30 which has been vacuum soldered, by heat and pressure, using a solder joint 32 for example made of an eutectic alloy of gold and tin, after resonator 2 has been mounted in main part 22.

This mounting of resonator 2 is achieved by soldering or gluing with a conductive adhesive connection pads 16 and 18 of the back face (see FIG. 2) onto corresponding conductive pads 34 provided on a step 36 of the bottom 24 located on one side of main part 22 of the case, these pads 34 being connected, in a manner not shown in the drawings, to external contact pads 37 and 38 disposed on the back face of bottom 24.

In these conditions, a large part of the resonator overhangs step 36 of the bottom of the case which supports it and this step 36 is relatively far away from the centre of gravity of the resonator.

Because of this, the resonator and its connection to the case do not have very good resistance to shocks.

On the other hand, the resonator is liable to tip towards the bottom of the case when it is fixed onto step 36 of this case.

Further, since the thermal expansion coefficients of ceramic material and quartz are different enough to create mechanical stresses in the resonator which can not only be felt in the arms of the tuning fork and disturb the working of the resonator when the temperature changes but can also break the solder or detach connection pads 16 and 18 of the resonator from those 34 of the case and alter or even cut the electric connection between the resonator electrodes and the external contact pads 37 and 38 of the case.

For the same reason, if there is an incipient fracture on the side of base 6 of the tuning fork where connection pads 16 and 18 are situated, a significant temperature variation can even break the tuning fork.

Finally, when the resonator is vacuum packed, the vacuum is never perfect and the stirring of the atmosphere by the tuning fork arms when the resonator vibrates can modify the operating parameters of the resonator when its arms come close to each other, more so than in the case of a metallic case.

The object of the invention is to provide a piezoelectric resonator and an assembly comprising this resonator enclosed in a case, which enables satisfactory solutions to be brought to the various problems posed by conventional tuning fork resonators.

Thus, the piezoelectric resonator according to the invention which is evidently intended to be mounted in a case and which includes a part in the shape of a tuning fork with two parallel arms connected to each other by a base and carrying electrodes to make them vibrate, these electrodes being connected to connection pads intended to be electrically connected to the exterior of said case, is characterised in that it also includes a central arm attached to said base and located between the arms of the tuning fork shaped part, substantially equidistant from said arms, this central arm having a greater mass than those of the arms of the tuning fork shaped part and said connection pads being carried by this central arm.

Moreover, when the resonator is enclosed in a hermetic parallelepiped shaped case, this case, which includes a main part with a bottom and sides in which said resonator is mounted and a cover fixed to this main part, is characterised in that it includes at least one support attached to its bottom and on which said central resonator arm is fixed.

Other features and advantages of the invention will appear upon reading the following description which refers to the annexed drawings in which:

FIGS. 1 and 2 are respectively top and bottom views of a known tuning fork resonator referred to hereinbefore;

FIG. 3 is a median and longitudinal cross-section view also referred to hereinbefore which shows how a resonator like that of FIGS. 1 and 2 is generally mounted in a ceramic SMD type case;

Figure 4:
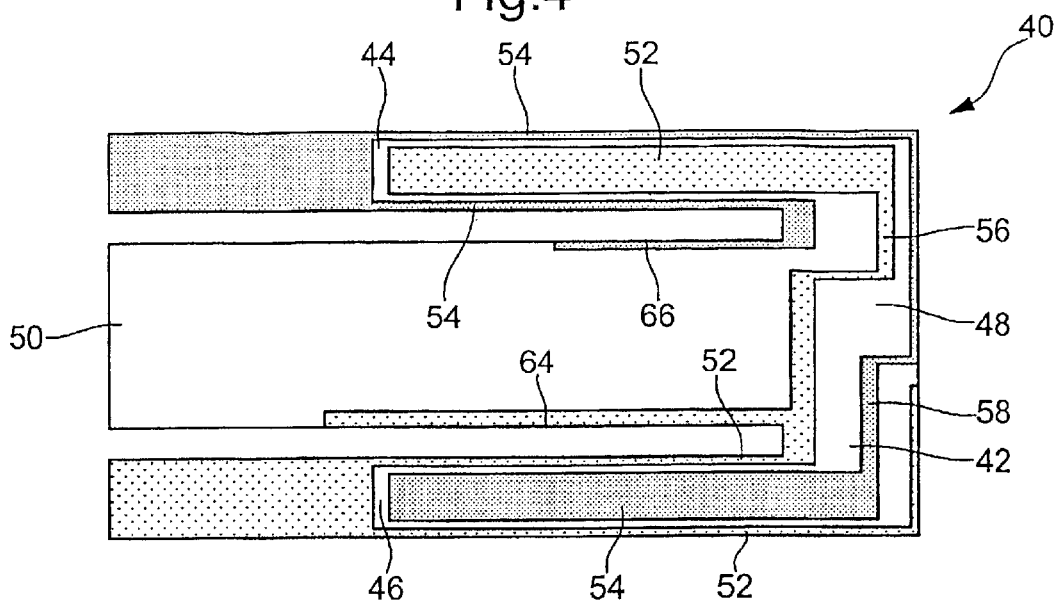
FIGS. 4 and 5 are respectively bottom and top views of a first embodiment of a piezoelectric resonator according to the invention.
Figure 5:
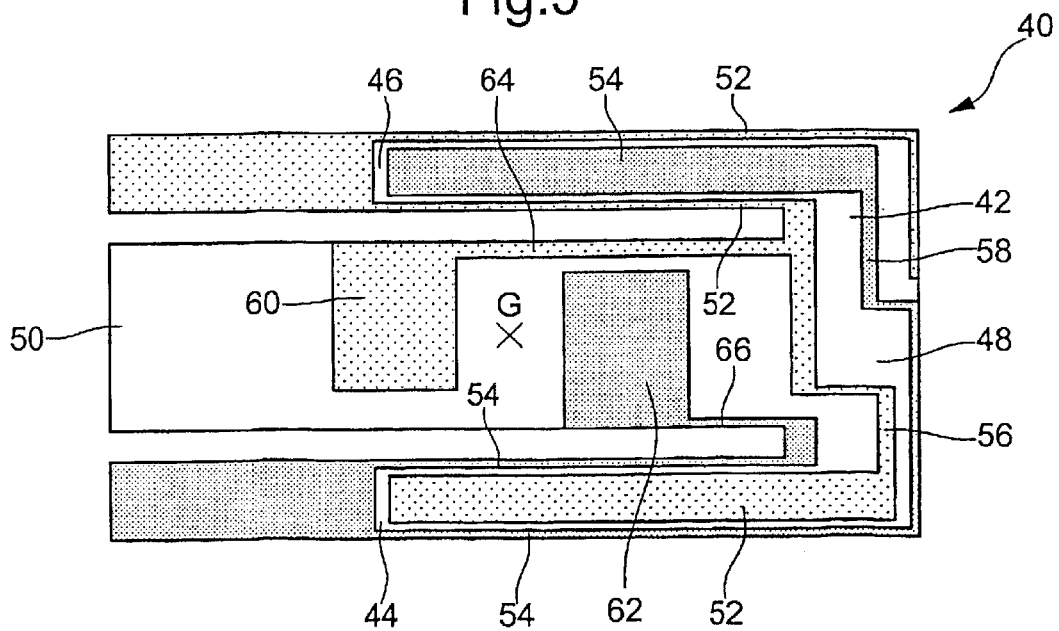

In the first embodiment shown in FIGS. 4 and 5 the resonator according to the invention, designated by the reference numeral 40, includes a tuning fork shaped part 42 with two arms 44 and 46 joined by a base 48 to which a central arm 50, located between arms 44 and 46 and parallel thereto, is attached, the whole assembly being made in a single piece and of quartz.

As it is shown in FIGS. 4 and 5, the width of central arm 50 is slightly more than twice that of an arm 44 or 46 of tuning fork shaped part 42, but this width could be a little greater or a little smaller.

Likewise, the length of central arm 50 is not necessarily equal to that of arms 44 and 46, as shown by FIGS. 4 and 5. It could for example be shorter.

However, it is important, on the one hand, that central arm 50 is substantially equidistant from arms 44 and 46, this distance being able to be equal to that which separates the arms of a conventional tuning fork resonator, like that of FIGS. 1 and 2, of the same dimensions, and that, on the other hand and for reasons that will appear hereinafter, this central arm has a much greater mass than that of arms 44 and 46 which have to vibrate.

This being said, as shown by FIGS. 4 and 5, arms 44 and 46 carry two groups of electrodes 52 and 54 similar to those of the resonator of FIGS. 1 and 2, which are connected to each other by conductive paths respectively 56 and 58, carried by base 48 of the tuning fork shaped part 42.

As they are shown in the drawing, these electrodes and conductive paths are disposed to make arms 44 and 46 vibrate in flexure mode, but they could have a different configuration to make the arms vibrate in the same mode or another mode (torsion, shearing, etc.).

To return to central arm 50, FIG. 5 shows that it carries on its back face two conductive connection pads 60 and 62 located on either side of the centre of gravity G of the resonator lengthways and preferably equidistant from it, these pads 60 and 62 being connected by conductive paths 64 and 66 respectively to conductive paths 56 and 58 which connect the electrodes of each group 52 and 54 to each other.

If the resonator 40 that has just been described, is compared to the tuning fork resonator 2 of FIGS. 1 and 2, it will be noted that in its longitudinal direction its base 48 is much narrower than that 6 of resonator 2. This is due to the fact that this base 48 no longer has to carry connection pads that are used both to mount the resonator in a case and to electrically connect its electrodes to the exterior of the case, which, as will be seen hereinafter, is the role of connection pads 60 and 62.

On the other hand, it is clear that because of third arm 50, resonator 40 is wider than a conventional tuning fork resonator whose arms have the same dimensions as those of arms 44 and 46. For prototypes already made by the Applicant, this increase is approximately 30% but, for a reason that will be indicated hereinafter, the fact that a resonator according to the invention is both shorter and wider than a conventional tuning fork resonator can be an advantage.

Finally, it is useful to note that a resonator like resonator 40 can be manufactured on a scale as large and at a price practically as low as a conventional tuning fork resonator and by using the same techniques.

Figure 6:
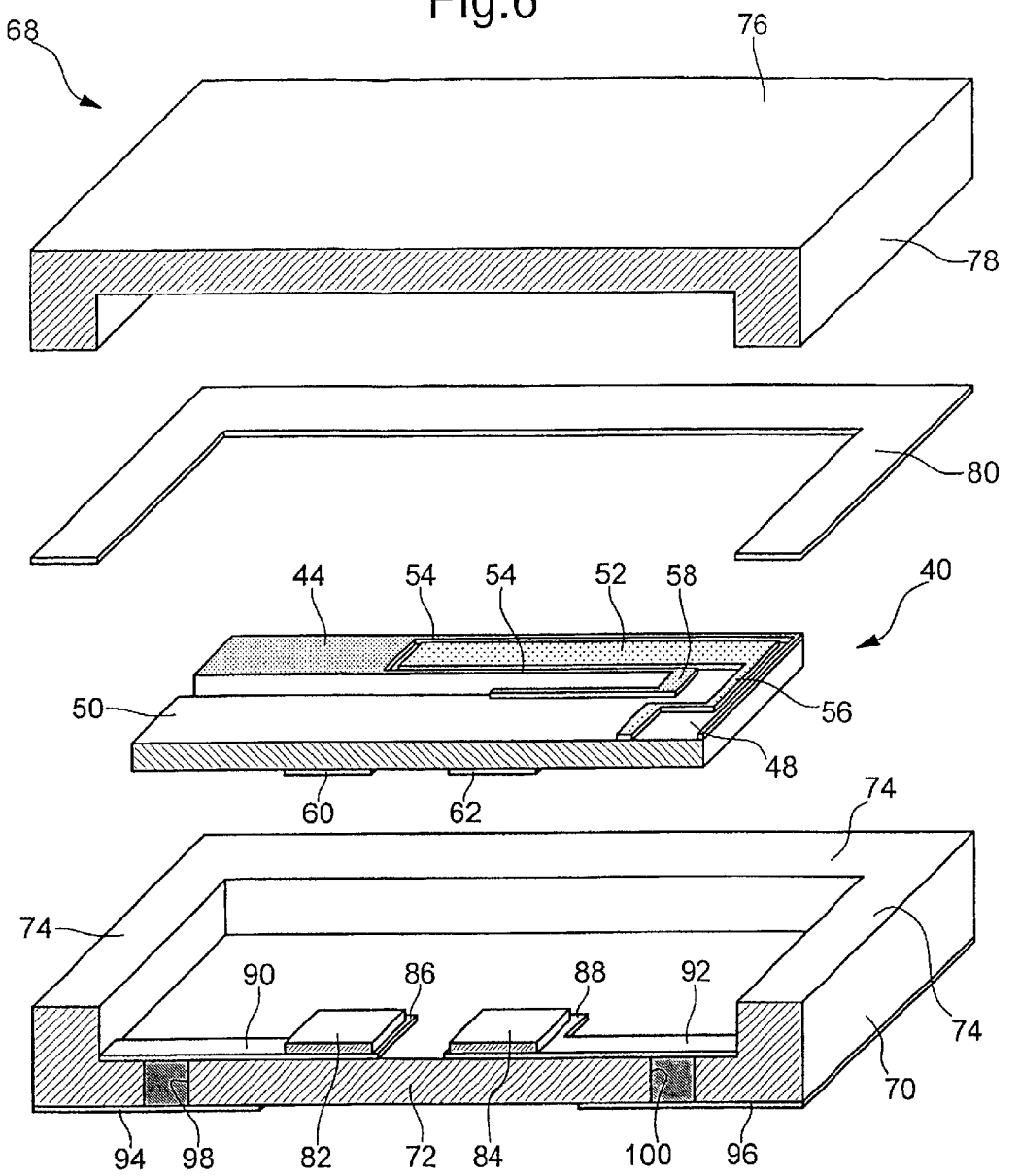
FIG. 6 is an exploded perspective and in median and longitudinal cross-section view showing how the resonator of FIGS. 4 and 5 is mounted in a case adapted thereto to form a resonator-case assembly in accordance with the invention.
Figure 7:
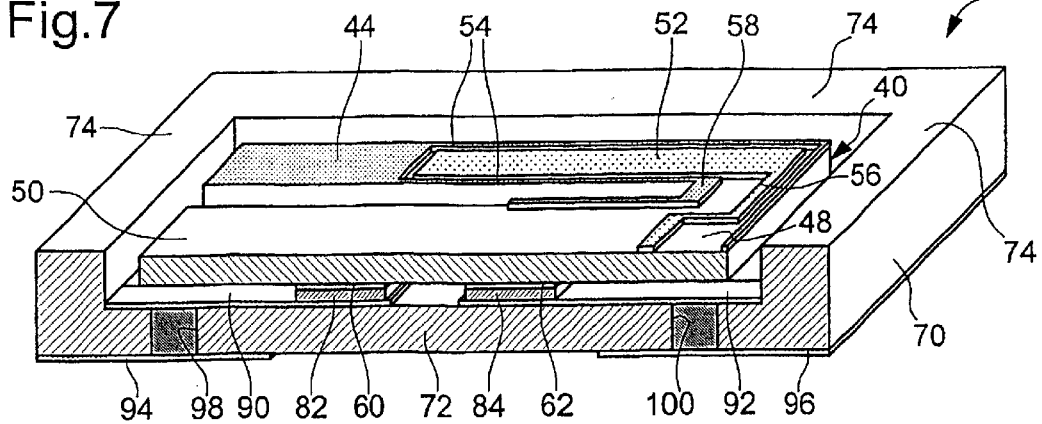
FIG. 7 is a perspective and median and longitudinal cross-section view which shows the resonator after it has been mounted in the case.

FIGS. 6 and 7 show how the resonator of FIGS. 4 and 5 can be mounted in a ceramic case to form an assembly according to the invention.

As can be seen in FIG. 6, this case of parallelepiped shape designated by the reference numeral 68, and only half of which is shown, includes a main part 70 formed by a flat bottom 72 and four sides 74 and a cover 76 with an edge 78 via which the cover is vacuum soldered, on sides 74 of main part 70, by heating and pressure, by means of a soldering frame 80, after resonator 40 has been mounted in main part 70.

This mounting of the resonator is achieved by soldering or gluing with a conductive adhesive its connection pads 60 and 62 onto respective studs 82 and 84, as is shown by FIG. 7.

Looking at FIG. 7, it can be seen that these studs 82 and 84 rest on conductive pads 86 and 88 located in the bottom of main part 70 and that these pads 86 and 88 are electrically connected to external contact pads 94 and 96 by inner paths 90 and 92 and by a conductive adhesive that fills holes 98 and 100 pierced in bottom 72 of the case, facing inner paths 90 and 92.

As shown in the drawing, studs 82 and 84 can be formed by galvanic deposition of thick layers of gold onto conductive pads 86 and 88, but they could be made differently. For example, these studs could be formed by small ceramic parts glued onto pads 86 and 88 and connection pads 60 and 62 of the resonator could then be glued onto these ceramic parts with a conductive adhesive which completely surrounds them in order to assure an electric connection between pads 60 and 62 and pads 86 and 88.

In any case, the fact of fixing the resonator to the bottom of the case, in the zone of its centre of gravity, makes the assembly thereof easier and minimises the risk of it tipping during such assembly.

For the same reason the shock resistance of the encased resonator is much higher.

On the other hand, because of the presence of studs 82 and 84, the resonator is no longer in such direct contact with the case as the tuning fork resonator of FIGS. 1 to 3. The stresses undergone by the resonator because of the difference between the thermal expansion coefficients between the quartz and ceramic material of which the case is formed are thus greatly attenuated and even if this were not the case, these stresses would only be exerted in a zone of third solid arm 50 surrounding the centre of gravity of the resonator and there would be practically no risk of the resonator being broken or at least of its operation being disturbed by such stresses.

Further, given that the third branch of resonator 40 has a greater mass than that of the base of a conventional tuning fork resonator there is better decoupling between the resonator and the case and consequently the performance of the encased resonator is improved.

It should also be added that, again as a result of the presence of the third arm and when the resonator vibrates in flexure mode, its two other arms are not as close to each other as in the case of a tuning fork resonator and come closer rather to the third arm, which means that the resonator is much less sensitive to the residual air pressure in the case.

It should also be noted that when resonator 40 is intended to vibrate in flexure mode, the first harmonic of its vibration frequency is much more attenuated than for a tuning fork resonator, which is an advantage if one wishes the resonator to vibrate only at its fundamental frequency.

Finally, the ratio between the length and width of a resonator like resonator 40 is not only better suited than a tuning fork resonator to be mounted in an SMD type case. This ratio can be calculated such that, while being as efficient, the resonator can be mounted in a case of square, not rectangular, shape, to facilitate manufacture of said case, and by giving studs 82, 84 and pads 86, 88 a suitable shape, for example an L shape, and by disposing them properly, for example such that the Ls form a square, without of course touching, it is possible to place the resonator in the case in four different positions, also to facilitate the automatized mounting of the resonator. Another less advantageous solution consists of multiplying the number of studs and pads by two.

Figure 8:
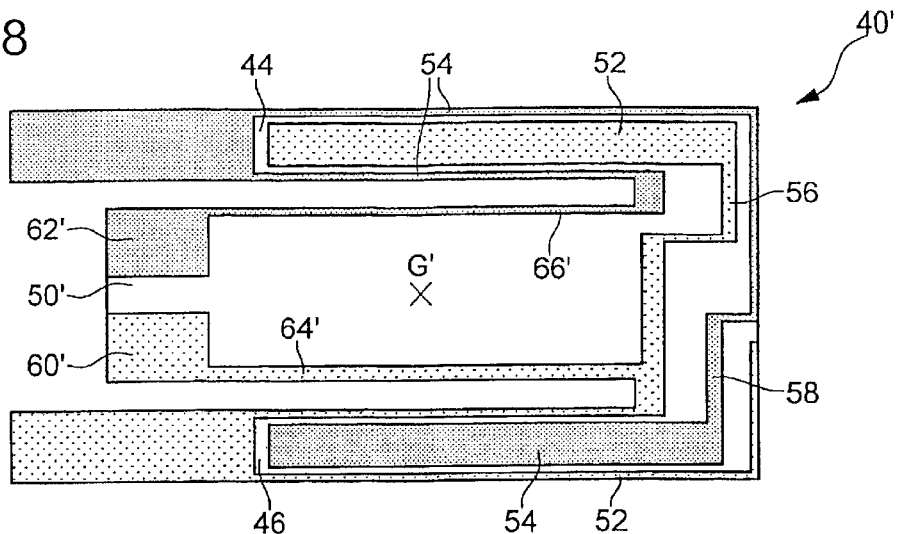
FIGS. 8 and 9 are respectively top and bottom views of a second embodiment of a piezoelectric resonator according to the invention.
Figure 9:
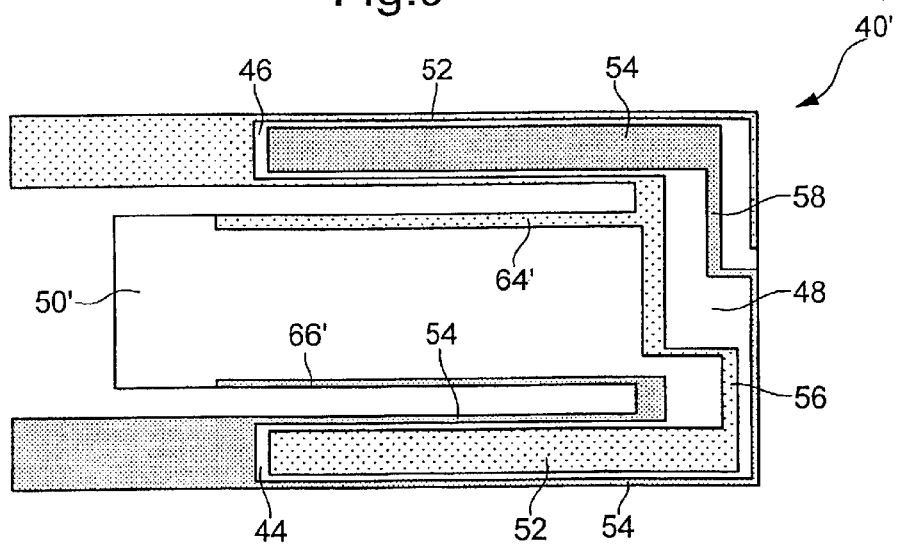

FIGS. 8 and 9 show top and bottom views of a second embodiment of the resonator according to the invention.

If resonator 40' of FIGS. 8 and 9 is compared to that 40 of FIGS. 4 and 5, it will be noted that they both include the same tuning fork shaped part and that only the central arm is different. There is thus no point in describing again this tuning fork shaped part, whose various elements are designated by the same reference numerals in FIGS. 8 and 9 as in FIGS. 4 and 5.

Again, comparing these Figures, it will be noted that there are in fact three differences between central arm 50 of the resonator of FIGS. 4 and 5 and that 50' of resonator 40' of FIGS. 8 and 9. First of all, it is a little shorter than arms 44 and 46 of the tuning fork shaped part. Secondly, it no longer has two connection pads on its back face, but two connection pads 60' and 62' on its front face, which are connected by conductive paths 64' and 66' to those 56 and 58 which connect electrodes 52 and 54 of arms 44 and 46 of tuning fork shaped part 42, to each other. And thirdly, these connection pads 60' and 62' are no longer located on either side of the centre of gravity G' of the resonator but at the end of central arm 50', on the side of its free end.

Figure 10:
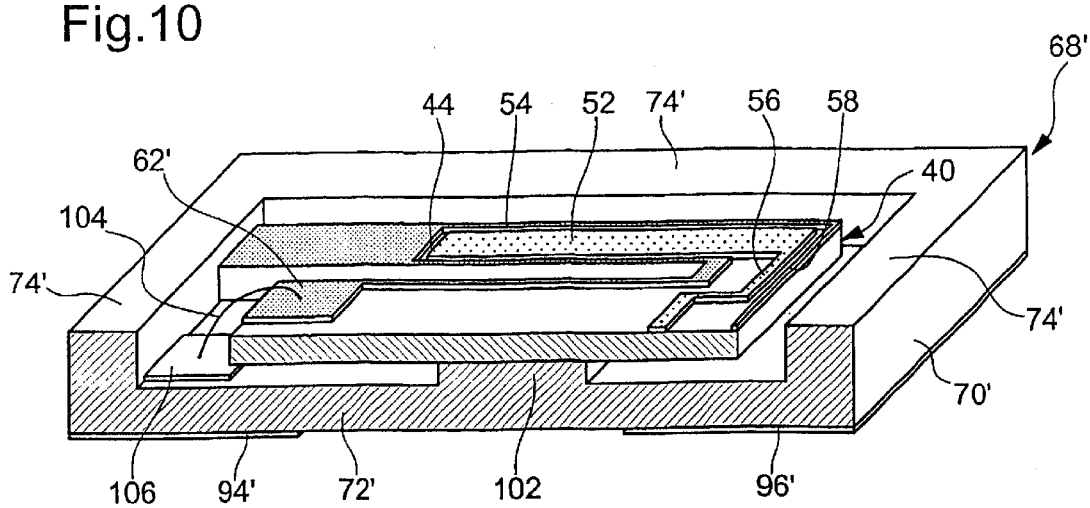
FIG. 10 is a similar view to that of FIG. 7 showing the resonator of FIGS. 8 and 9 after it has been mounted in a suitable case.

FIG. 10 which corresponds to FIG. 7 shows how resonator 40' can be mounted in a parallelepiped ceramic case 68' to form a resonator-case assembly according to the invention.

This case 68' includes a main part 70' only half of which can be seen in the Figure and which is formed by a bottom 72' and four sides 74'.

In order to allow resonator 40' to be mounted, the inner face of bottom 72' has a projecting part 102 of parallelepiped shape whose dimension in the direction of the width of the case is preferably substantially equal to or slightly less than the width of central arm 50' of the resonator and which is located such that its centre is more or less perpendicular to centre of gravity G' of the resonator when the latter is fixed, for example by gluing, to this projecting part.

It is to be noted that, according to a variant of this second embodiment of the resonator-case assembly according to the invention, projecting part 102 of bottom 72' could be replaced by a part made of ceramic material or any other insulating material fixed, for example by gluing, to the bottom of the case. This other material could even advantageously be chosen to have a thermal expansion coefficient comprised between those of the ceramic material of the case and the quartz of the resonator in order to reduce the stresses undergone by central arm 50' of this resonator due to temperature differences.

It is also to be noted that in this second embodiment, projecting part 102 is only used to support the resonator and does not play any role in the electric connection between the resonator and external contact pads 94' and 96' of the case.

This electric connection role is assured by conductive wires 104, only one of which is visible in FIG. 10 and one end of which is fixed by soldering or gluing with a conductive adhesive to connection pads 60' and 62' of the resonator (see FIG. 8) and the other end of which is fixed in the same manner to conductive pads 106 located in the bottom of the case, in accordance with the well known wire bonding technique.

Conductive pad 106, which is the only one visible in FIG. 10, can be directly electrically connected to external pad 94' by a conductive adhesive filling a through hole pierced in bottom 72 of the case which does not appear in FIG. 10. The other conductive pad 106 which is also not visible in FIG. 10, can be connected to external pad 96' in the same manner but via a conductive path carried by the bottom of the case.

In order to avoid reducing the mass of third arm 50' of the resonator and bringing centre of gravity G' thereof closer to its base 48 it would be possible for this third arm to have the same length as arms 44 and 46 of tuning fork shaped part 42 but, because of the way in which connection pads 60' and 62' of the resonator are connected to pads 106 of the case, this may mean that the length of the case has to be increased, which would not be desirable. Moreover, it is clear that the invention is not limited to the embodiments which have been described and to the variants which have been envisaged.

For example, in order to better mechanically decouple the tuning fork shaped part of the resonator from its central arm, the latter could have notches to reduce its width at the location of its attachment to the main part.

On the other hand, even if it is not specially designed to be included in a square case, the resonator according to the invention could very well be mounted on more than two studs, for example three, in order to seat it better.

Further, the inner conductive pads of the case could be connected to the external contact pads in a different manner than by holes pierced in the bottom of the case and filled with conductive adhesive.

Finally, although the resonator according to the invention has been more particularly designed to be placed in ceramic cases, it could also be included in hybrid cases including a main ceramic part and a glass or metal cover or in cases made completely of metal or glass, as has already been proposed for conventional tuning fork resonators and of course by adapting such cases to the resonator according to the invention.

What is claimed is:

1. A piezoelectric resonator intended to be mounted in a case and including a tuning fork shaped part with two parallel arms, connected to each other by a base and carrying electrodes to make them vibrate, these electrodes being connected to connection pads intended to be electrically connected to the exterior of said case, and a central arm attached to said base and located between the arms of the tuning fork shaped part, substantially equidistant from these arms, said central arm having a mass greater than that of the tuning fork shaped part and said connection pads being carried by said central arm.

2. A resonator according to claim 1, wherein said tuning fork shaped part and said central arm are formed by a single piece made of quartz.

3. A resonator according to claim 1, wherein the width of said central arm is greater or equal to twice the width of the arms of the tuning fork shaped part.

4. A resonator according to claim 1, wherein the length of said central arm is substantially equal to that of the arms of the tuning fork shaped part.

5. A resonator according to claim 1, wherein the length of said central arm is less than that of the arms of the tuning fork shaped part.

6. A resonator according to claim 1, wherein said central arm carries on one of its faces, two connection pads located on either side of the centre of gravity G of the resonator, in the longitudinal direction of said resonator.

7. A resonator according to claim 6, wherein said connection pads are located at substantially equal distances from said centre of gravity G.

8. A resonator according to claim 1, wherein said central arm carries on one of its faces two connection pads located at the end of said arm, on the side of its free end.

9. An assembly comprising a piezoelectric resonator and a hermetic case of parallelepipedic shape, including a main part with a bottom and sides, in which said resonator is mounted and a cover fixed to said main part, said resonator including a tuning fork shaped part with two parallel arms connected to each other by a base and carrying electrodes to make them vibrate, these electrodes being connected to connection pads electrically connected to the exterior of the case, said resonator also including a central arm attached to said base and located between the arms of the tuning fork shaped part, substantially equidistant from the latter, this central arm having a greater mass than those of the arms of the tuning fork shaped part and carrying said connection pads, and said case including at least one support secured to its bottom, on which said central arm of the resonator is fixed.

10. An assembly according to claim 9, wherein said tuning fork shaped part and said central arm of the resonator are formed by a single piece made of quartz.

11. An assembly according to claim 9, wherein the width of said central arm of the resonator is greater than or equal to twice the width of the arms of said tuning fork shaped part.

12. An assembly according to claim 9, wherein the length of said central arm of the resonator is substantially equal to that of the arms of said tuning fork shaped part.

13. An assembly according to claim 9, wherein said central arm of the resonator carries on its back face oriented towards the bottom of the case two connection pads located on either side of the centre of gravity G of the resonator and in that said central arm is fixed at the location of these connection pads on two studs secured to two conductive pads located in the bottom of the main part of the case, such that said connection pads are electrically connected to these conductive pads which are themselves electrically connected to the exterior of the case.

14. An assembly according to claim 13, wherein said studs are formed by thick metal layers deposited on said conductive pads.

15. An assembly according to claim 13, wherein said studs are parts made of electrically insulating material fixed on said conductive pads and on which said connection pads of the resonator are fixed by a conductive adhesive, such that said adhesive surrounds said parts to electrically connect said connection pads to said conductive pads.

16. An assembly according to claim 9, wherein the length of said central arm of the resonator is less than that of the arms of said tuning fork shaped part and carries two connection pads located at the end of said central arm, on the side of its free end, wherein said support is formed by an inner projecting portion of the bottom of the main part of the case and on which said central arm is fixed such that the centre of gravity of the resonator is located substantially perpendicular to the centre of said projecting part and wherein said connection pads of the resonator are respectively connected to two conductive pads located in the bottom of the main part of the case by two conductive wires each fixed to one of its ends on one of said connection pads of the resonator and at its other end on one of said conductive pads, said conductive pads being themselves electrically connected to the exterior of the case.

17. An assembly according to claim 13, wherein the main part and the cover of the case are made of ceramic material.

18. An assembly according to claim 17, wherein said conductive pads are electrically connected to external contact pads carried by said bottom of the main part of the case by inner conductive paths and conductive adhesive filling holes pierced in said bottom.

19. A resonator according to claim 1, designed to vibrate in flexure mode.

* * * * *